(12) United States Patent
Dunn (10) Patent No.: US 7,767,386 B2
(45) Date of Patent: Aug. 3, 2010

(54) METHOD OF PATTERNING AN ORGANIC PLANARIZATION LAYER

(75) Inventor: Shannon W. Dunn, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 11/623,247

(22) Filed: Jan. 15, 2007

(65) Prior Publication Data

US 2008/0171269 A1   Jul. 17, 2008

(51) Int. Cl.
*G03F 7/26* (2006.01)
(52) U.S. Cl. .................................................. 430/323
(58) Field of Classification Search ................. 430/311, 430/323, 322
See application file for complete search history.

(56) References Cited

U.S. PATENT DOCUMENTS

| | | | |
|---|---|---|---|
| 5,753,417 A | | 5/1998 | Ulrich |
| 7,432,191 B1 | | 10/2008 | Stamper et al. |
| 2002/0081531 A1 | * | 6/2002 | Jain ........................... 430/322 |
| 2003/0129531 A1 | | 7/2003 | Oberlander et al. |
| 2003/0205658 A1 | * | 11/2003 | Voisin ...................... 249/187.1 |
| 2005/0074699 A1 | * | 4/2005 | Sun et al. ..................... 430/312 |
| 2005/0116231 A1 | | 6/2005 | Kang et al. |
| 2005/0153538 A1 | | 7/2005 | Tsai et al. |
| 2005/0167394 A1 | | 8/2005 | Liu et al. |
| 2006/0003268 A1 | | 1/2006 | Hong et al. |
| 2006/0177772 A1 | | 8/2006 | Abdallah et al. |
| 2006/0222968 A1 | * | 10/2006 | Talin et al. ....................... 430/5 |
| 2006/0223245 A9 | | 10/2006 | Pellens et al. |
| 2006/0290012 A1 | | 12/2006 | Sadjadi |
| 2007/0077523 A1 | | 4/2007 | Finders |
| 2007/0148598 A1 | | 6/2007 | Colburn et al. |
| 2007/0166648 A1 | | 7/2007 | Ponoth et al. |
| 2008/0020327 A1 | * | 1/2008 | Yang et al. .................. 430/313 |

OTHER PUBLICATIONS

U.S. Patent and Trademark Office, Non-final Office Action received in related U.S. Appl. No. 11/534,420, dated Dec. 23, 2008, 23 pp.
U.S. Patent and Trademark Office, Non-final Office Action received in related U.S. Appl. No. 11/534,365, dated Jun. 24, 2008, 14 pp.
U.S. Patent and Trademark Office, Non-final Office Action received in related U.S. Appl. No. 11/534,477, dated Jun. 23, 2008, 23 pp.

(Continued)

*Primary Examiner*—Kathleen Duda
*Assistant Examiner*—Brittany Raymond
(74) *Attorney, Agent, or Firm*—Wood, Herron & Evans, LLP (57) ABSTRACT

A method of patterning a thin film is described. The method comprises forming a thin film to be patterned on a substrate, forming a developable organic planarization layer (OPL) on the thin film, forming a developable anti-reflective coating (ARC) layer on the developable OPL, and forming a mask layer on the developable ARC layer. Thereafter, the mask layer, the developable ARC layer and the developable OPL are patterned to form a pattern therein using an imaging and developing process. The imaging and developing process may either partially extend or fully extend into the OPL. Once the mask layer is removed, the pattern is transferred to the underlying thin film using an etching process.

20 Claims, 7 Drawing Sheets

OTHER PUBLICATIONS

U.S. Patent and Trademark Office, Non-final Office Action received in related U.S. Appl. No. 11/534,261, dated Jun. 23, 2008, 14 pp.
European Patent Office, Search Report and Written Opinion received in related International Application No. PCT/US2007/077166, dated Dec. 20, 2007, 13 pp.
U.S. Patent and Trademark Office, Non-final Office Action received in related U.S. Appl. No. 11/534,477, dated Jan. 12, 2009, 14 pp.
U.S. Patent and Trademark Office, Non-final Office Action received in related U.S. Appl. No. 11/534,261, dated Jan. 15, 2009, 12 pp.
U.S. Patent and Trademark Office, Final Office Action received in related U.S. Appl. No. 11/534,365 dated Mar. 19, 2009, 16 pp.
State Intellectual Property Office of the People's Republic of China, First Office Action received in related Chinese Patent Application No. 200710151302.9 dated Jan. 16, 2009, 7 pp.
U.S. Patent and Trademark Office, Non-final Office Action received in related U.S. Appl. No. 11/534,365 dated Sep. 4, 2009, 15 pp.
U.S. Patent and Trademark Office, Non-final Office Action received in related U.S. Appl. No. 11/623,237 dated Sep. 15, 2009, 16 pp.
U.S. Patent and Trademark Office, Non-final Office Action received in related U.S. Appl. No. 11/534,538 dated Jul. 13, 2009, 16 pp.
U.S. Patent and Trademark Office, Final Office Action received in related U.S. Appl. No. 11/534,477 dated Aug. 7, 2009, 17 pp.
U.S. Patent and Trademark Office, Final Office Action received in related U.S. Appl. No. 11/534,261 dated Aug. 28, 2009, 12 pp.
U.S. Patent and Trademark Office, Final Office Action received in related U.S. Appl. No. 11/534,538 dated Jan. 26, 2010, 12 pp.
U.S. Patent and Trademark Office, Non-Final Office Action received in related U.S. Appl. No. 11/534,477, dated Oct. 23, 2009, 16 pp.
U.S. Patent and Trademark Office, Non-Final Office Action received in related U.S. Appl. No. 11/534,365 dated Feb. 22, 2010, 18 pp.
U.S. Patent and Trademark Office, Non-Final Office Action received in related U.S. Appl. No. 11/623,237 dated Mar. 9, 2010, 18 pp.

* cited by examiner

METHOD OF PATTERNING AN ORGANIC PLANARIZATION LAYER

CROSS-REFERENCE TO RELATED APPLICATIONS

This application is related to co-pending U.S. patent application Ser. No. 11/623,237, entitled "METHOD OF DOUBLE PATTERNING A THIN FILM USING A DEVELOPABLE ANTI-REFLECTIVE COATING AND A DEVELOPABLE ORGANIC PLANARIZATION LAYER", filed on even date herewith; pending U.S. patent application Ser. No. 11/534,261, entitled "METHOD AND SYSTEM FOR DOUBLE IMAGING A DEVELOPABLE ANTI-REFLECTIVE COATING", filed on Sep. 22, 2006; pending U.S. patent application Ser. No. 11/534,365, entitled "METHOD AND SYSTEM FOR DOUBLE PATTERNING A DEVELOPABLE ANTI-REFLECTIVE COATING", filed on Sep. 22, 2006; pending U.S. patent application Ser. No. 11/534,420, entitled "METHOD OF PATTERNING AN ANTI-REFLECTIVE COATING BY PARTIAL ETCHING", filed on Sep. 22, 2006; pending U.S. patent application Ser. No. 11/534,477, entitled "METHOD OF PATTERNING A DEVELOPABLE ANTI-REFLECTIVE COATING BY PARTIAL DEVELOPING", filed on Sep. 22, 2006; and pending U.S. patent application Ser. No. 11/534,538, entitled "METHOD FOR DOUBLE PATTERNING A THIN FILM", filed on Sep. 22, 2006. The entire contents of these applications are herein incorporated by reference in their entirety.

BACKGROUND OF THE INVENTION

1. Field of the Invention

The present invention relates to a method for patterning a thin film on a substrate, and more particularly to a method for patterning a thin film on a substrate using a developable anti-reflective coating (ARC) layer and a developable organic planarization layer (OPL).

2. Description of Related Art

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

More recently, in order to meet the increasing demand to produce smaller features, the use of multi-layer masks has become more prevalent. By utilizing a multi-layer mask, the top mask layer, which comprises a light-sensitive material as described above, may be thinner and, hence, a smaller feature size may be achieved using conventional photo-lithography techniques. However, in order to generate a mask layer of sufficient thickness for the ensuing primary etch process, additional material layers are formed underlying the top mask layer. The pattern, formed in the top mask layer using lithographic techniques, is transferred to the underlying layer or layers that comprise the mask layer for the primary etch process using dry processing, such as additional etching processes.

SUMMARY OF THE INVENTION

The present invention relates to a method for patterning a thin film on a substrate.

According to one embodiment, a method of patterning a thin film using a developable anti-reflective coating (ARC) layer and a developable organic planarization layer (OPL) is described.

According to another embodiment, a method of patterning a thin film on a substrate is described, comprising: preparing a film stack on the substrate, the film stack comprising the thin film formed on the substrate, a developable organic planarization layer (OPL) on the thin film, a developable anti-reflective coating (ARC) layer formed on the developable OPL, and a layer of photo-resist formed on the developable ARC layer; imaging the layer of photo-resist, the developable ARC layer and the developable OPL with an image pattern; and developing the layer of photo-resist, the developable ARC layer and the developable OPL to form the image pattern in the layer of photo-resist, the developable ARC layer and the developable OPL.

According to another embodiment, a method of patterning a thin film on a substrate is described, comprising: preparing a film stack on the substrate, the film stack comprising the thin film formed on the substrate, a developable organic planarization layer (OPL) on the thin film, a developable anti-reflective coating (ARC) layer formed on the developable OPL, and a layer of photo-resist formed on the developable ARC layer; imaging the layer of photo-resist with an image pattern; imaging the developable ARC layer with the image pattern; partially imaging the developable OPL with the image pattern to a depth less than the thickness of the developable OPL; developing the layer of photo-resist, the developable ARC layer and the developable OPL to form the image pattern through the layer of photo-resist and the developable ARC layer, and partially extending into the developable OPL; and completing the transfer of the image pattern to the developable OPL using a dry etching process.

According to yet another embodiment, a method of patterning a thin film on a substrate is described, comprising: preparing a film stack on the substrate, the film stack comprising the thin film formed on the substrate, a developable organic planarization layer (OPL) on the thin film, a developable anti-reflective coating (ARC) layer formed on the developable OPL, and a layer of photo-resist formed on the developable ARC layer; imaging the layer of photo-resist with an image pattern; imaging the developable ARC layer with the image pattern; fully imaging the developable OPL with the image pattern such that the image pattern extends through the thickness of the developable OPL; and developing the layer of photo-resist, the developable ARC layer and the developable OPL to form the image pattern through the layer of photo-resist, the developable ARC layer and the developable OPL.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

Figure 1A:
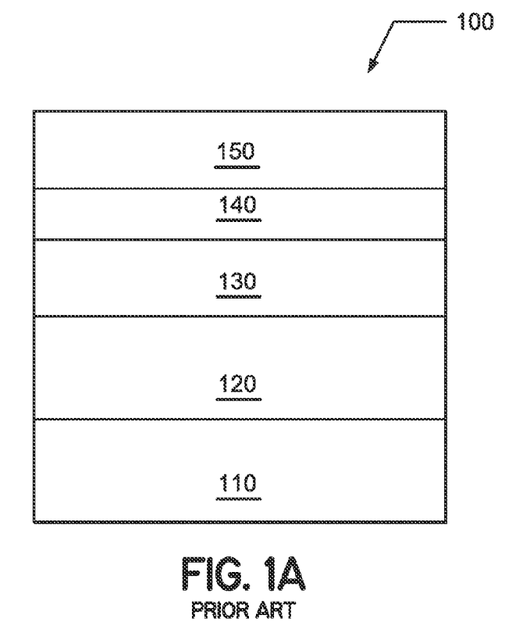
FIGS. 1A through 1F illustrate schematically a known method for patterning a thin film on a substrate.

As described above, multi-layer masks have been utilized to allow the patterning of smaller features than what is currently possible with standard lithographic techniques. Referring now to the drawings wherein like reference numerals designate identical or corresponding parts throughout the several views, FIGS. 1A through 1F schematically illustrate a method of patterning a substrate according to the prior art. As illustrated in FIG. 1A, a lithographic structure 100 comprises a film stack formed on substrate 110. The film stack comprises a thin film 120, such as a dielectric layer, formed on substrate 110, an organic planarization layer (OPL) 130 formed on the thin film 120, an anti-reflective coating (ARC) layer 140 formed on the OPL 130, and a layer of photo-resist 150 formed on the ARC layer 140.

Figure 1B:
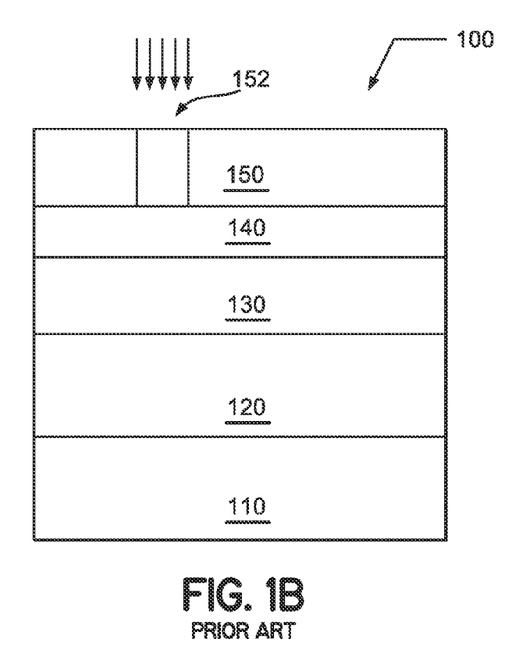
Figure 1C:
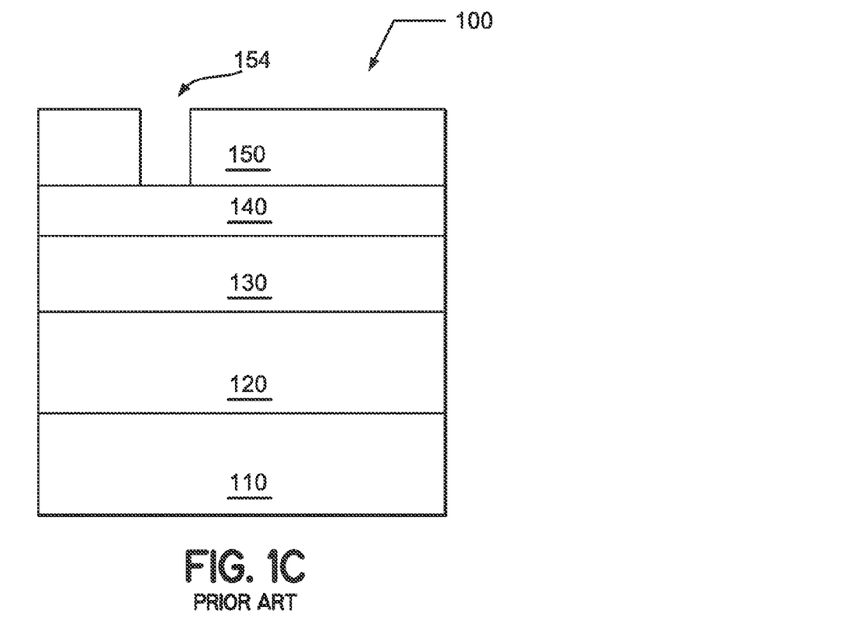
Figure 1D:
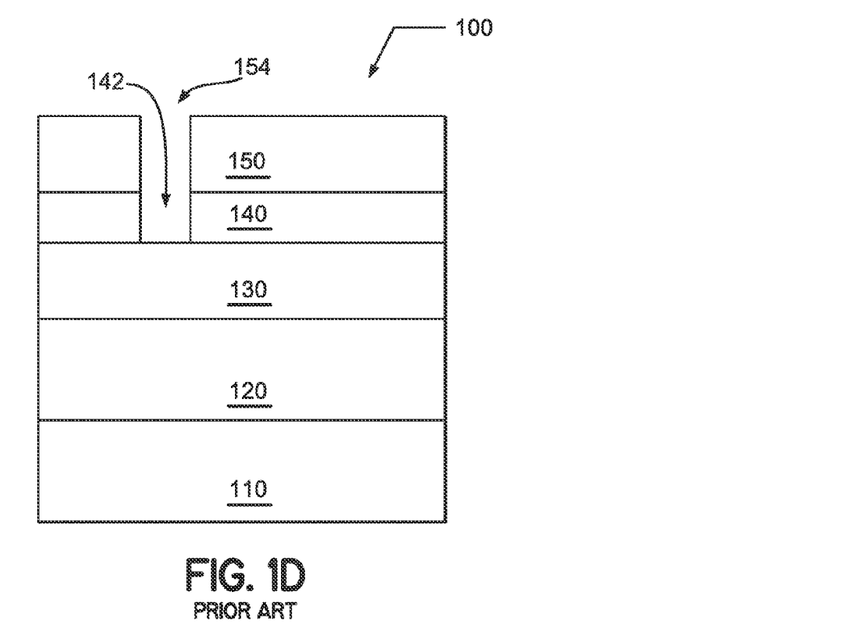

As shown in FIG. 1B, the photo-resist 150 is exposed to an image pattern 152 using a photo-lithography system, and thereafter in FIG. 1C, the image pattern 152 is developed in a developing solvent to form a pattern 154 in the photo-resist layer 150. The pattern 154 in the photo-resist layer 150 is transferred to the underlying ARC layer 140 using a dry etching process to form an ARC pattern 142 as shown in FIG. 1D.

Figure 1E:
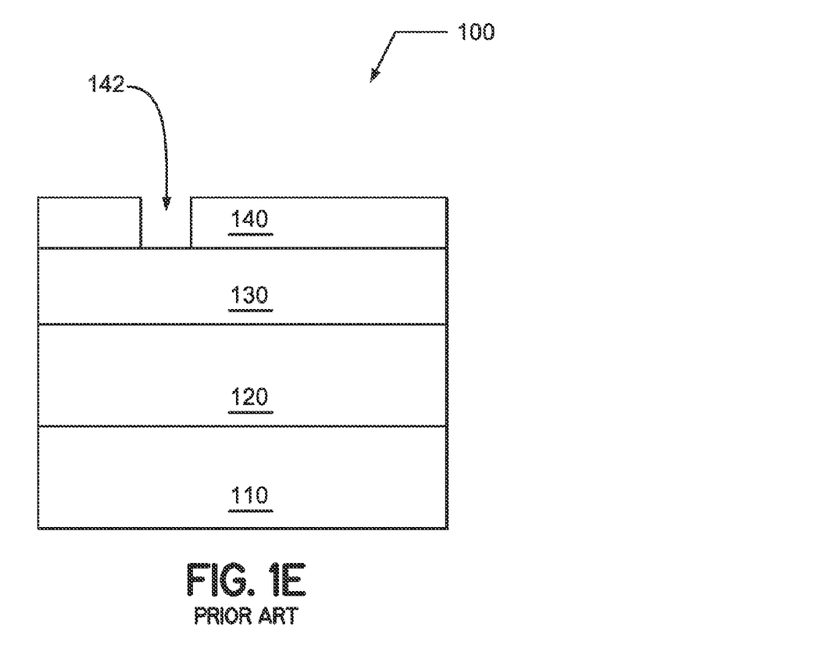
Figure 1F:
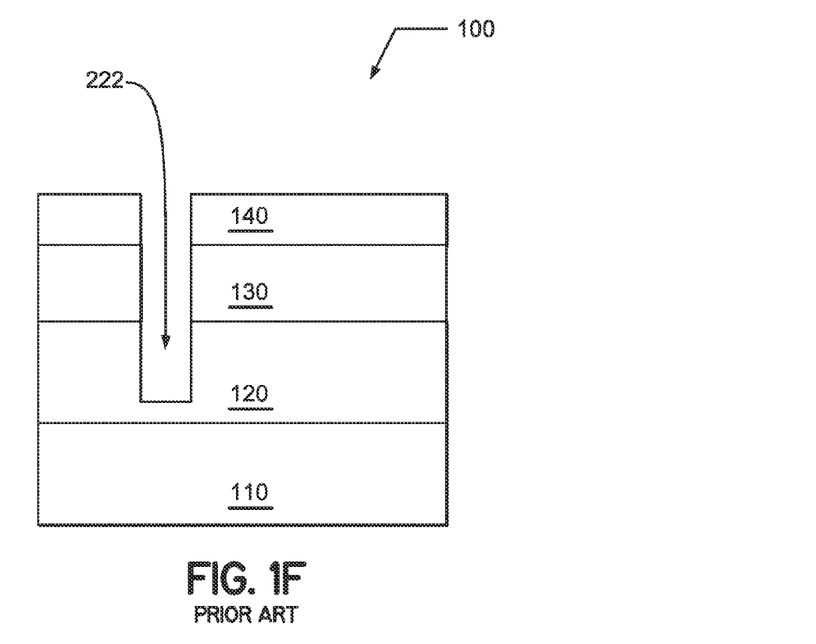

Now, as shown in FIG. 1E, photo-resist layer 150 is removed using, for instance, an ashing process. As illustrated in FIGS. 1F, the ARC pattern 142 is transferred to the underlying OPL 130 and the thin film 120 to form a feature pattern 122 using one or more etching processes.

Figure 2A:
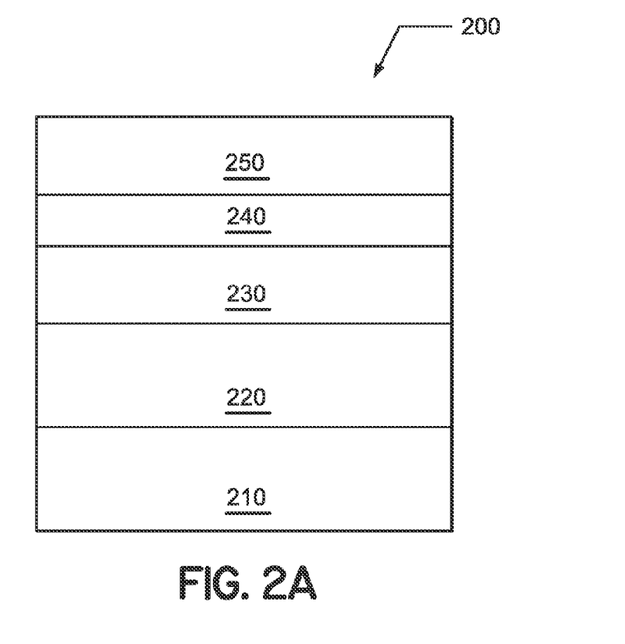
FIGS. 2A through 2F illustrate schematically a method for patterning a thin film on a substrate according to an embodiment of the invention.
Figure 2B:
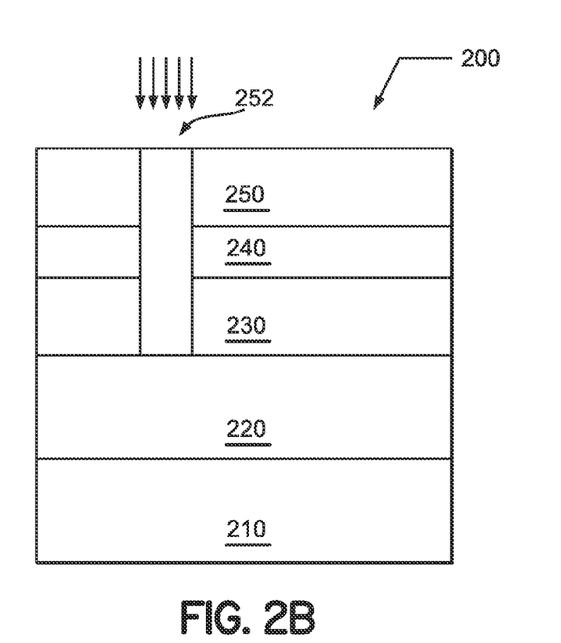
Figure 2C:
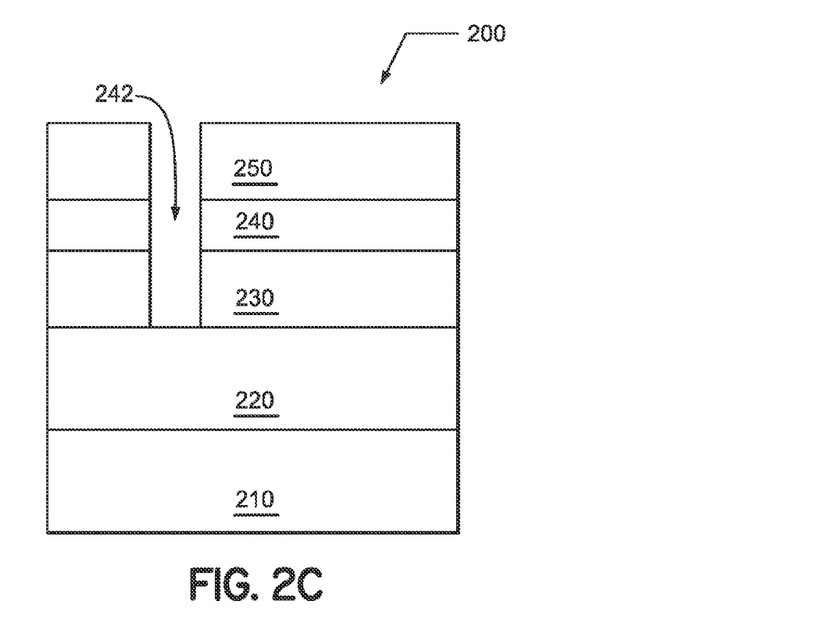
Figure 2D:
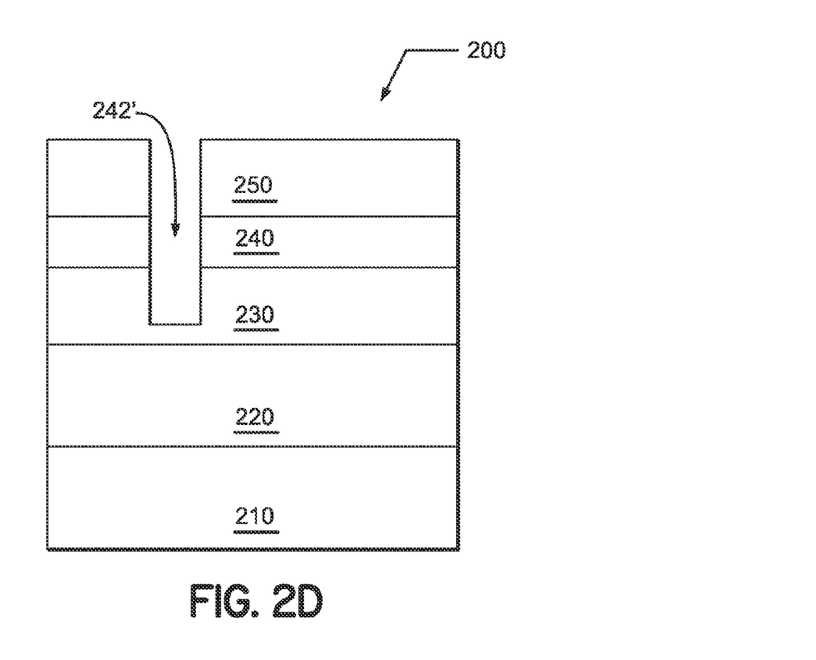
Figure 2E:
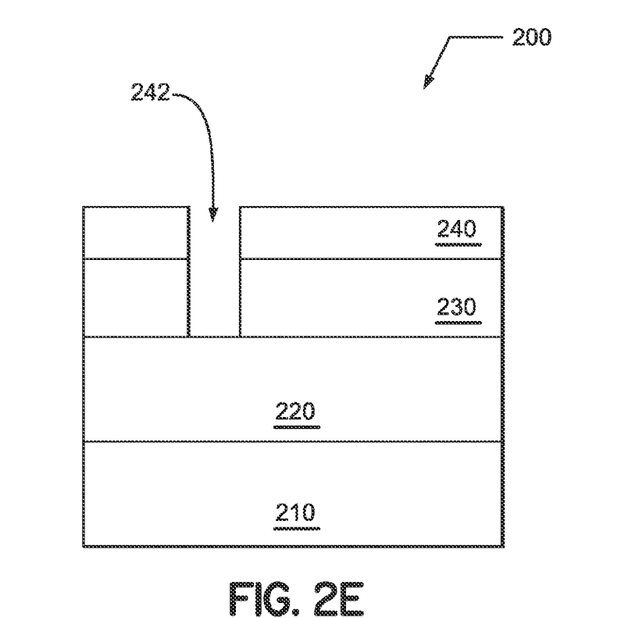
Figure 2F:
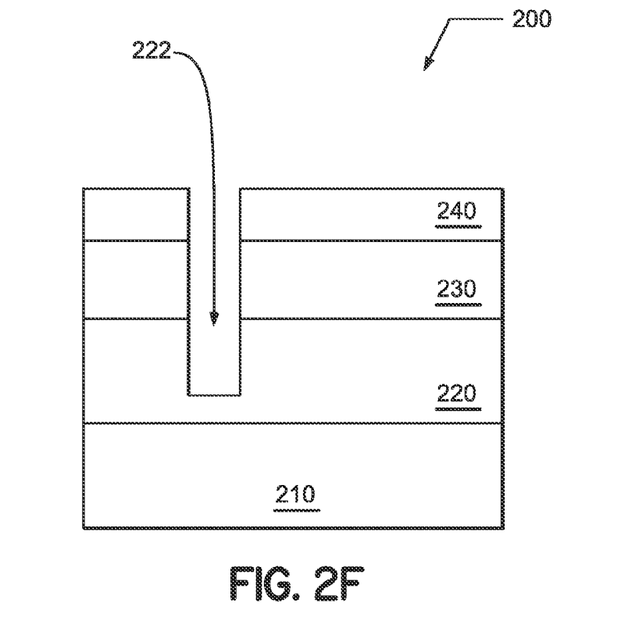
Figure 3:
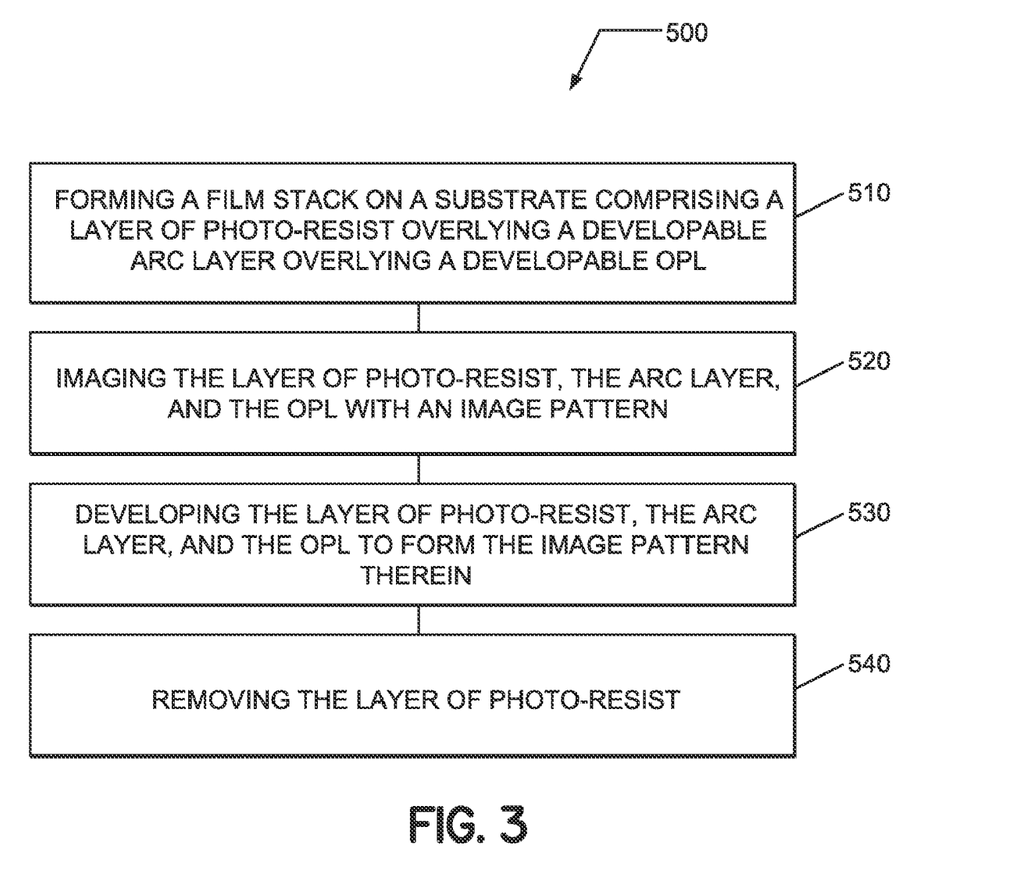
FIG. 3 illustrates a flow chart of a method for patterning a thin film on a substrate according to an embodiment of the invention.

According to an embodiment of the invention, a method of patterning a substrate is schematically illustrated in FIGS. 2A through 2F, and is illustrated in a flow chart 500 in FIG. 3. The method begins in 510 with forming a lithographic structure 200 comprising a film stack formed on substrate 210. The film stack comprises a thin film 220 formed on substrate 210, a developable organic planarization layer (OPL) 230 formed on the thin film 220, a developable anti-reflective coating (ARC) layer 240 formed on the developable OPL 230, and a layer of photo-resist 250 formed on the developable ARC layer 240.

The thin film 220 may comprise a conductive layer, a non-conductive layer, or a semi-conductive layer. For instance, the thin film 220 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film 220 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 220 may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The developable OPL 230 can include a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the developable OPL 230 may comprise any organic polymer and a photo-active compound having a molecular structure that can attach to the molecular structure of the organic polymer. The fabrication of a photo-sensitive organic polymer is understood to one skilled in the art of organic chemistry or polymer chemistry. Furthermore, the developable OPL 230 is selected to be compatible with the overlying developable ARC layer 240, the overlying photo-resist layer 250 and the lithographic wavelength, i.e., ArF, KrF, etc. The developable OPL 230 may, for example, be applied using spin coating technology.

The developable ARC layer 240 possesses material properties suitable for use as an anti-reflective coating. Additionally, the developable ARC layer 240 comprises a light-sensitive material that, when exposed to electromagnetic (EM) radiation, is chemically altered and thus configured to be removed using a developing solvent. For example, the developable ARC layer 240 may comprise (wet) developable anti-reflective coatings commercially available from Brewer Science. Inc. (2401 Brewer Drive, Rolla, Mo. 65401). Additionally, the developable ARC layer 240 is selected to be compatible with the overlying photo-resist layer 250 and the lithographic wavelength, i.e., ArF, KrF, etc. The developable ARC layer 240 may, for example, be applied using spin coating technology.

The photo-resist layer 250 may comprise 248 nm (nanometer) resists, 193 nm resists, 157 nm resists, or EUV (extreme ultraviolet) resists. The photo-resist layer 250 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

In 520 and as shown in FIG. 2B, the photo-resist layer 250, the developable ARC layer 240 and the developable OPL 230 are imaged with an image pattern 252. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

As illustrated in FIG. 2B, the exposure may extend through the entire thickness of the first photo-resist layer 250, the developable ARC layer 240 and the developable OPL 230. Alternatively, the exposure may extend through the entire thickness of the photo-resist layer 250 and the developable ARC layer 240, and then extend only partially through the thickness of the developable OPL 230.

In 530 and as shown in FIG. 2C, the exposed photo-resist layer 250, the exposed developable ARC layer 240, and the exposed developable OPL 230 are subjected to a developing process in order to remove the image pattern 252, and form a pattern 242 in the developable ARC 240 and the developable OPL 230. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

Alternatively, when the image exposure extends partially through the developable OPL 230 and this partially exposed region is developed, the developing process leads to the formation of a partially complete pattern 242' in the developable OPL 230 as shown in FIG. 2D. The partially complete pattern 242' extends to a depth within the developable OPL 230 that is less than the thickness of the developable OPL 240. In doing so, the photo-resist layer 250 may be removed prior to completing the pattern transfer to the developable OPL 230, thereby preventing exposure of the thin film 220 to the photo-resist removal process. The completion of the pattern transfer to the developable OPL 230 may be performed using an etching process, such as a dry etching process or a wet etching process. The etching process may be performed immediately following the developing process for the image pattern, for example. Alternatively, the etching process may be performed following the removal of the layer of photo-resist 250.

In 540 and as shown in FIG. 2E, the layer of photo-resist 250 is removed. For example, the first photo-resist layer 250 may be removed using a wet stripping process, a dry plasma ashing process, or a dry non-plasma ashing process.

As illustrated in FIG. 2F, the pattern 242 is transferred to the underlying thin film 220 to form a feature pattern 222 using one or more etching processes. The one or more etching processes may include any combination of wet or dry etching processes. The dry etching processes may include dry plasma etching processes or dry non-plasma etching processes. The one or more etching processes may be designed to consume the developable ARC layer 240.

Although only certain embodiments of this invention have been described in detail above, those skilled in the art will readily appreciate that many modifications are possible in the embodiments without materially departing from the novel teachings and advantages of this invention. For example, several embodiments illustrate the use of positive tone developable resists, developable ARC layers and developable OPLs; however, other embodiments are contemplated that utilize negative tone developable resists, developable ARC layers and developable OPLs. Accordingly, all such modifications are intended to be included within the scope of this invention.

What is claimed is:

1. A method of patterning a thin film on a substrate, comprising:
preparing a film stack on said substrate, said film stack comprising said thin film formed on said substrate, a developable organic planarization layer (OPL) on said thin film, a developable anti-reflective coating (ARC) layer formed on said developable OPL, and a layer of photo-resist formed on said developable ARC layer;
imaging said layer of photo-resist, said developable ARC layer and said developable OPL with an image pattern, wherein said imaging said developable OPL comprises partially imaging said developable OPL to a depth less than a thickness of said developable OPL;
developing said layer of photo-resist, said developable ARC layer and said developable OPL to said depth without exposing said thin film, to form said image pattern through said layer of photo-resist, through said developable ARC layer and partially into said developable OPL, and
completing a transfer of said image pattern by performing an etching process to extend said image pattern from said depth in said developable OPL through the thickness of said developable OPL to expose said thin film.

2. The method of claim 1, wherein said etching process is a dry etching process.

3. The method of claim 1, further comprising:
removing said layer of photo-resist following said developing of said image pattern in said developable ARC layer and said developable OPL.

4. The method of claim 1, further comprising:
transferring said image pattern in said developable ARC layer and said developable OPL to said thin film using an etching process.

5. The method of claim 4, wherein said transferring comprises performing a wet etching process, or a dry etching process, or a combination thereof.

6. The method of claim 1, wherein said preparing said film stack comprises forming a 248 nm photo-resist, a 193 nm photo-resist, a 157 nm photo-resist, or an EUV photo-resist, or a combination of two or more thereof on said developable ARC layer.

7. The method of claim 1, wherein said imaging said image pattern comprises imaging an image pattern using a dry lithography system, or a wet lithography system, or both.

8. The method of claim 1, wherein said imaging said image pattern comprises imaging an image pattern using a 248 nm photo-lithography system, a 193 nm photo-lithography system, a 157 nm photo-lithography system, or an EUV photo-lithography system, or a combination of two or more thereof.

9. The method of claim 1, wherein said preparing said film stack comprises forming said developable ARC layer configured for 248 nm photo-lithography, 193 nm photo-lithography, 157 nm photo-lithography, or EUV photo-lithography.

10. The method of claim 1, wherein said preparing said film stack comprises forming a developable OPL configured for 248 nm photo-lithography, 193 nm photo-lithography, 157 nm photo-lithography, or EUV photo-lithography.

11. The method of claim 1, wherein said preparing said film stack comprises applying said developable OPL to said thin film using a spin coating system.

12. A method of patterning a thin film on a substrate, comprising:
preparing a film stack on said substrate, said film stack comprising said thin film formed on said substrate, a developable organic planarization layer (OPL) on said thin film, a developable anti-reflective coating (ARC) layer formed on said developable OPL, and a layer of photo-resist formed on said developable ARC layer;
imaging said layer of photo-resist with an image pattern;
imaging said developable ARC layer with said image pattern;
fully imaging said developable OPL with said image pattern such that said image pattern extends through a thickness of said developable OPL;
developing said layer of photo-resist, said developable ARC layer and said developable OPL, wherein said developing said developable OPL forms said image pattern to a depth less than the thickness of said developable OPL without exposing said thin film, to form said image pattern through said layer of photo-resist, through said developable ARC layer and partially through said developable OPL, and
completing a transfer of said image pattern by performing an etching process to extend said image pattern from said depth in said developable OPL through the thickness of said developable OPL to expose said thin film.

13. The method of claim 12, wherein said etching process is a d etching process.

14. The method of claim 12, further comprising:
removing said layer of photo-resist following said developing of said image pattern in said developable ARC layer and said developable OPL.

15. The method of claim 12, further comprising:
transferring said image pattern in said developable ARC layer and said developable OPL to said thin film using a wet etching process, a wet lithography process, or a combination thereof.

16. The method of claim 12, further comprising:
transferring said image pattern in said developable ARC layer and said developable OPL to said thin film using a dry etching process, a dry lithography process, or a combination thereof.

17. The method of claim 12, wherein said preparing said film stack comprises forming a 248 nm photo-resist, a 193 nm photo-resist, a 157 nm photo-resist, or an EUV photo-resist, or a combination of two or more thereof on said developable ARC layer.

18. The method of claim 12, wherein said imaging said image pattern comprises imaging an image pattern using a 248 nm photo-lithography system, a 193 nm photo-lithography system, a 157 nm photo-lithography system, or an EUV photo-lithography system, or a combination of two or more thereof.

19. The method of claim 12, wherein said preparing said film stack comprises forming said developable ARC layer or said developable OPL configured for 248 nm photo-lithography, 193 nm photo-lithography, 157 nm photo-lithography, or EUV photo-lithography.

20. The method of claim 12, wherein said preparing said film stack comprises applying said developable OPL to said thin film using a spin coating system.

* * * * *

UNITED STATES PATENT AND TRADEMARK OFFICE
CERTIFICATE OF CORRECTION

| | | |
|---|---|---|
| PATENT NO. | : 7,767,386 B2 | Page 1 of 1 |
| APPLICATION NO. | : 11/623247 | |
| DATED | : August 3, 2010 | |
| INVENTOR(S) | : Shannon W. Dunn | |

It is certified that error appears in the above-identified patent and that said Letters Patent is hereby corrected as shown below:

Col. 8, line 4, "is a d etching process." should read --is a dry etching process.--.

Signed and Sealed this
Eighteenth Day of January, 2011

David J. Kappos
*Director of the United States Patent and Trademark Office*